United States Patent [19]

Aulich et al.

[11] Patent Number: 4,643,833

[45] Date of Patent: Feb. 17, 1987

[54] METHOD FOR SEPARATING SOLID REACTION PRODUCTS FROM SILICON PRODUCED IN AN ARC FURNACE

[75] Inventors: Hubert Aulich, Munich; Friedrich-Wilhelm Schulze, Eching, both of Fed. Rep. of Germany

[73] Assignee: Siemens Aktiengesellschaft, Berlin and Munich, Fed. Rep. of Germany

[21] Appl. No.: 726,492

[22] Filed: Apr. 23, 1985

[30] Foreign Application Priority Data

May 4, 1984 [DE] Fed. Rep. of Germany ....... 3416543

[51] Int. Cl.⁴ ..................... B01D 37/00; C01B 33/02
[52] U.S. Cl. ..................... 210/714; 210/774; 210/807; 210/290; 210/773; 423/348; 156/608; 156/617 SP; 156/DIG. 64
[58] Field of Search ............... 423/348, 350; 156/608, 156/607, 617 R, 617 SP, 617 V, 617 H, DIG. 64; 210/714, 767, 774, 807, 510.1, 503, 504, 290, 773

[56] References Cited

U.S. PATENT DOCUMENTS

| 4,366,024 | 12/1982 | Ast et al. ........................ 423/348 |
| 4,388,080 | 6/1983 | Kapur et al. .................... 423/348 |
| 4,388,286 | 6/1983 | Kapur et al. .................... 423/348 |
| 4,515,600 | 5/1985 | Dietl et al. ..................... 423/348 |
| 4,539,194 | 9/1985 | Halvorsen ....................... 423/348 |

FOREIGN PATENT DOCUMENTS

| 7063 | 1/1980 | European Pat. Off. ............ 423/348 |
| 3220338 | 12/1983 | Fed. Rep. of Germany ...... 423/348 |
| 3411955 | 10/1985 | Fed. Rep. of Germany ...... 423/348 |

Primary Examiner—Benoit Castel
Attorney, Agent, or Firm—Hill, Van Santen, Steadman & Simpson

[57] ABSTRACT

In a method for separating solid reaction products from silicon produced in an arc furnace, molten silicon produced in the arc furnace in a reduction of $SiO_2$ and carbon is filtered through a heated layer composed of SiC/Si after a so-called holding phase at a temperature in a region above a melting point of the silicon. The layer is preferably fashioned as a bottom plate of a crucible. The melt has eliminated from it $SiO_2$ and SiC particles contained therein. The method serves for the production of silicon for solar cells. Due to the separation of $SiO_2$ and SiC out of the molten silicon, an efficiency of above 10% is achieved in the solar cells fabricated from this material.

8 Claims, 3 Drawing Figures

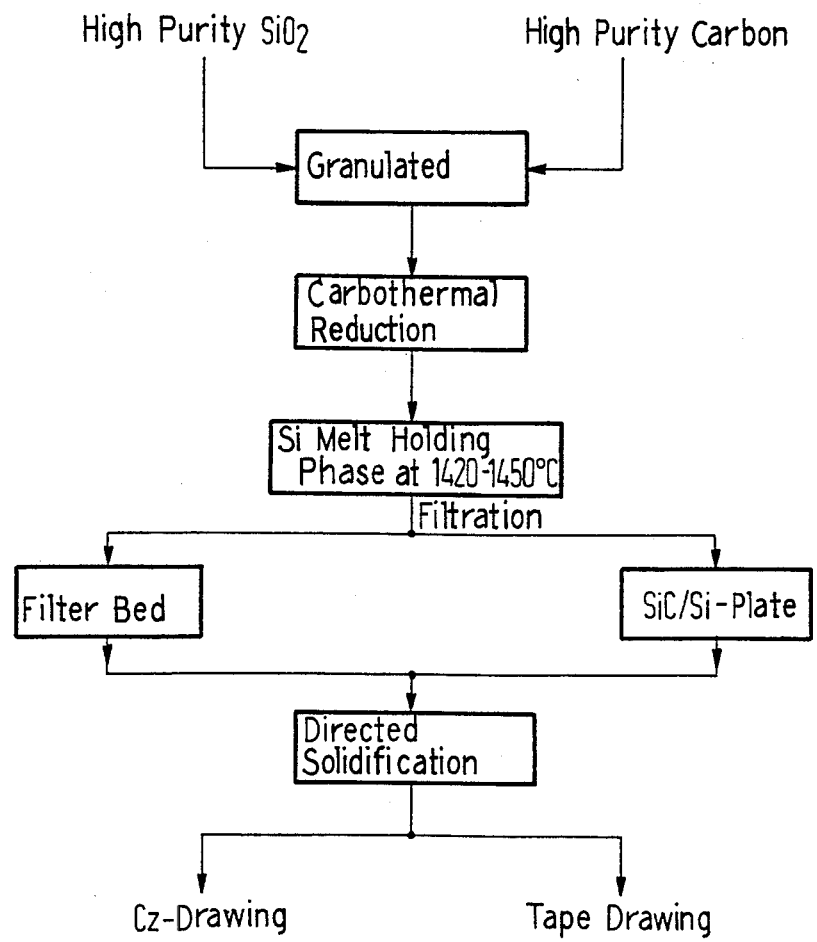

METHOD FOR SEPARATING SOLID REACTION PRODUCTS FROM SILICON PRODUCED IN AN ARC FURNACE

BACKGROUND OF THE INVENTION

The invention relates to a method for separating solid reaction products such as $SiO_2$ and SiC from the molten silicon produced in an arc furnace from the reduction of $SiO_2$ and carbon.

For an economical utilization of solar energy with solar cells of crystalline silicon, the costs for the production of the silicon must be substantially lowered. The best-known and presently most cost-beneficial method for producing silicon is the carbothermic reduction of quartz in an arc furnace. Such a method may be derived, for example, from the book "Silizium als Halbleiter" by R. Rost, published by Verlag Berliner Union, Stuttgart, pages 18,19, incorporated herein by reference. As a consequence of the highly contaminated starting materials such as quartz, oil coke, charcoal, and coal that are used in this method, the silicon produced only has a purity of 96 to 98.5% and is thus unsuitable for the manufacture of solar cells.

U.S. Pat. No. 4,247,528, incorporated herein by reference, discloses a method for the production of solar cell silicon in an arc furnace wherein high-purity starting substances ($SiO_2$ and soot) are processed under high-purity conditions. As a result thereof, the boron and phosphorous content and the content of heavy metals are lowered and a purity of 99.9% is achieved; however, contaminants are still contained in the melt in the form of solid reaction products (non-reduced quartz, non-reacted carbon and silicon carbide particles) which complicate a further processing into silicon crystals. A double Czochralski drawing process by means of which all particles are eliminated has proven itself in this regard. The solar cells manufactured from this material have efficiencies greater than 10%. The additional process steps of crystal drawing, however, are expensive and involved.

SUMMARY OF THE INVENTION

It is an object of the invention to specify a method which simplifies this method. In particular, it should be possible to supply the produced silicon immediately for the manufacture of silicon bodies for solar cells, i.e. without additional crystal drawing processes.

The German patent application No. P 34 11 955.8, incorporated herein by reference, has proposed for this purpose that the molten silicon emerging from the high-temperature furnace be conducted through a filter composed of graphite having a specific density below 1.85 g/cm³, whereby the solid constituents are retained in the filter and the silicon flows through.

A further method of this type is proposed in the German patent application No. P 34 03 131.6, incorporated herein by reference, whereby the silicon is melted after the carbothermic reduction in a highly compressed graphite crucible, whereby the non-reduced quartz and the non-reacted coal collect at the crucible wall.

The invention embarks upon a different solution and achieves the above object in that the molten silicon, after a so-called "holding phase", is filtered through a heated layer composed of the composite material SiC/Si at a temperature in a region above the melting point of silicon, is collected in high-purity graphite ingot molds, and is subjected to a directed solidification.

It thus results within the framework of the invention that a graphite crucible, whose floor is composed of a plate of SiC/Si, is employed for the filtration. The SiC content is thus set such that "channels" having a diameter below 3 $\mu$m arise in the filtration.

Molded bodies, for example crucibles, plates, etc., of the composite material SiC/Si are industrially produced by immersing porous carbon preforms into a silicon melt. A great quantity of the carbon is thus converted into SiC; after removal of the preform from the melt, the pores are filled with silicon. The ratio SiC:Si as well as the pore distribution can be set within broad limits by the selection of the carbon preform and of the reaction conditions with the silicon melt.

According to another exemplary embodiment of the teaching of the invention, however, filter beds composed of SiC grains can be employed instead of the SiC/Si plate, whereby the grain size of the SiC increases in the flowing direction of the molten silicon.

BRIEF DESCRIPTION OF THE DRAWINGS

FIG. 1 illustrates a method sequence of the invention by a flow chart;

DESCRIPTION OF THE PREFERRED EMBODIMENTS

According to FIG. 1, high-purity $SiO_2$ and high-purity carbon are converted as granulates into silicon in the arc furnace. The silicon melt is collected in vessels of high-purity graphite and is subsequently held at a temperature a few degrees above the melting point (1420° through 1450° C.) for a longer time. A minimum holding time of 30 minutes is necessary given a crucible height of about 15 cm. The holding time increases with increasing crucible height. hours. In this "holding phase", the SiC particles sink to the floor of the vessel due to their higher specific weight, whereas the light weight $SiO_2$ particles float on the melt surface. The holding phase temperature is established as close as possible to the melting point of silicon in order to diminish the solubility of SiC in the melt. A further goal of the holding phase is the conversion of superfine SiC suspended particles into larger SiC crystals which then easily sink to the floor. After the holding phase, the molten silicon is conducted through a heated filter plate composed of the composite material SiC/Si. The solid particles (SiC, $SiO_2$) are thus retained at the filter plate. The filtration preferably occurs such that the floor of a high-purity graphite crucible is replaced by a thin plate of SiC/C. At temperatures above the melting point of silicon, the silicon present in the graphite crucible flows out and thus open superfine "channels". Investigations have shown that the majority of the SiC particles have a size between 3 and 10 $\mu$m. For an effective filtration, the diameter of the "channels" in the SiC/Si plate should lie below 3 $\mu$m.

Figure 1A:
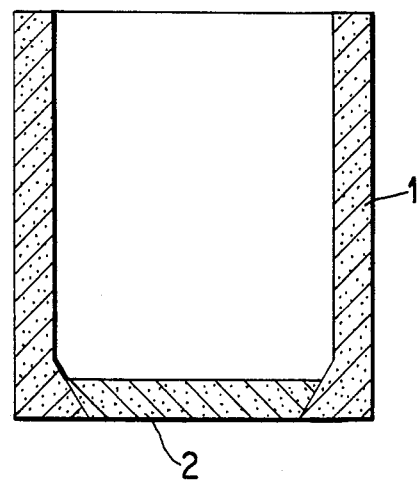
FIG. 1a illustrates a high-purity graphite ingot mold with a floor of SiC/Si material.

As shown in FIG. 1a, a graphite crucible 1 is provided with a floor portion 2 which is an insert plate of SiC/Si. The plate 2 of SiC/Si is composed of a mixture of 90% SiC+10% Si and is manufactured according to the equation $SiC + 2Si + C \rightarrow 2SiC + Si$. The plate is commercially available (Sigri Co.=Siemens Griesheim). The SiC core diameter is set such that a specific channel diameter results.

Figure 2:
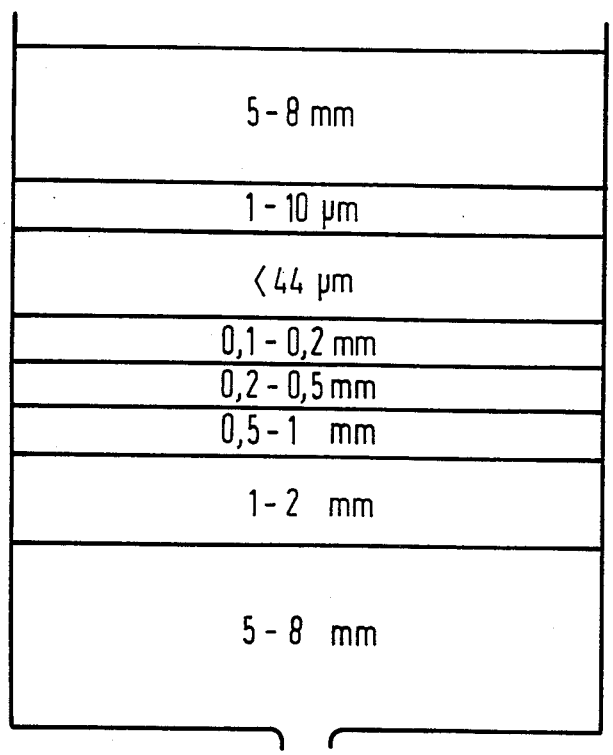
FIG. 2 illustrates a section through a silicon carbide filter of the invention.

Alternatively to filtration through a plate made of an SiC/Si composite material, FIG. 2 shows that a filter bed of SiC grains can also be employed. The filter bed is constructed up such that the grain size of the SiC increases from about 1 μm to 8 μm in the flowing direction of the silicon melt. The filter bed comprises a cover layer of 5 to 8 mm SiC grains which prevents fine particles from being stirred up. The height of the filter bed amounts to 30 to 40 mm.

After the filtration, the silicon is collected in high-purity graphite ingot molds and is subjected in known prior art manner to a directional solidification. By means of a Czochralski drawing process, this material can be subsequently converted into monocrystalline silicon rods or into polycrystalline silicon ribbons with a ribbon-drawing process. In both cases, silicon bodies are obtained which, after they are divided, are suitable for the manufacture of solar cells having an efficiency above 10%.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for separating solid reaction products including $SiO_2$ and SiC from molten silicon produced in an arc furnace in the reduction of $SiO_2$ and carbon, comprising the steps of:
   providing a holding phase during which the molten silicon is maintained at a temperature in a region above a melting point of silicon;
   providing a graphite crucible having a floor formed of a plate of SiC/Si, and setting an SiC content in the SiC/Si plate such that channels having a diameter of equal to or less than 3 μm arise in the SiC/Si plate during the filtering;
   filtering the molten silicon at a temperature above the melting point of silicon through the SiC/Si plate;
   collecting the filtered molten silicon in high-purity graphite ingot molds; and
   subjecting the collected molten silicon to a directional solidification.

2. A method according to claim 1 including the step of setting the temperature of the holding phase in a range of 1425° to 1450° C.

3. A method according to claim 1 wherein after the directional solidification, subjecting the crystalline silicon to a Czochralski drawing process for production of monocrystalline silicon rods.

4. A method according to claim 1 wherein after the directional solidification, remelting and converting the crystalline silicon into polycrystalline silicon ribbons by a ribbon drawing process.

5. A method according to claim 1 including the step of using the solidified molten silicon as a component in solar cells.

6. A method for producing solar cell molten silicon, comprising the steps of:
   heating the silicon and holding it for at least one hour at a temperature in a region above a melting point of silicon;
   filtering the molten silicon through a heated layer formed of a composite material SiC/Si which has channels preventing flow-through the SiC particles larger than 3 μm so as to separate solid reaction products $SiO_2$ and SiC from the molten silicon; and
   collecting the filtered molten silicon.

7. A method for separating solid reaction products including $SiO_2$ and SiC from molten silicon produced in an arc furnace in the reduction of $SiO_2$ and carbon, comprising the steps of:
   providing a holding phase during which the molten silicon is maintained at a temperature in a region above a melting point of silicon;
   filtering the molten silicon through a filter bed composed of SiC grains having a size which increases in a flowing direction of the molten silicon, an uppermost layer of the filter bed being formed of SiC grains having a dimension of from 1 through 10 μm and a lowest layer of the bed being formed of SiC grains having a dimension of from 5 through 8 mm;
   collecting the filtered molten silicon in high-purity graphite ingot molds; and
   subjecting the collected molten silicon to a directional solidification.

8. A method for producing silicon cell molten silicon, comprising the steps of:
   providing molten silicon and holding it for at least one hour at a temperature in a region above a melting point of the silicon;
   filtering the molten silicon through a filter bed composed of SiC grains whose grain size increases in a flowing direction of the molten silicon; and
   collecting the filtered molten silicon.

* * * * *